United States Patent [19]

Doo

[11] 4,358,326

[45] Nov. 9, 1982

[54] EPITAXIALLY EXTENDED POLYCRYSTALLINE STRUCTURES UTILIZING A PREDEPOSIT OF AMORPHOUS SILICON WITH SUBSEQUENT ANNEALING

[75] Inventor: Ven Y. Doo, San Jose, Calif.

[73] Assignee: International Business Machines Corporation, Armonk, N.Y.

[21] Appl. No.: 203,039

[22] Filed: Nov. 3, 1980

[51] Int. Cl.³ ................... H01L 21/205; H01L 21/324
[52] U.S. Cl. ..................................... 148/174; 29/571; 29/590; 148/1.5; 357/59; 427/86
[58] Field of Search ................... 148/1.5, 174; 29/571, 29/590; 427/86; 357/59

[56] References Cited

U.S. PATENT DOCUMENTS

| | | |
|---|---|---|
| 3,370,980 | 2/1968 | Anderson . |
| 3,479,237 | 11/1969 | Bergh et al. . |
| 3,519,901 | 7/1970 | Bean et al. . |
| 3,533,857 | 10/1970 | Mayer et al. . |
| 3,558,374 | 1/1971 | Boss et al. ............................ 148/174 |
| 3,586,542 | 6/1971 | Mac Rae . |
| 3,589,949 | 6/1971 | Nelson . |
| 3,730,765 | 5/1973 | Stein ................................ 148/174 X |
| 3,736,192 | 5/1973 | Tokuyama et al. . |
| 3,811,076 | 5/1974 | Smith, Jr. . |
| 3,841,926 | 10/1974 | Garnache et al. . |
| 3,900,345 | 8/1975 | Lesk . |
| 4,087,571 | 5/1978 | Kamins et al. ......................... 427/86 |
| 4,123,300 | 10/1978 | Joshi et al. . |
| 4,249,968 | 2/1981 | Gardiner et al. .................... 148/174 |
| 4,270,960 | 6/1981 | Bollen et al. ......................... 148/174 |

OTHER PUBLICATIONS

*IBM-TDB*, "Improving the Electrical Characteristics of Ion Implantation", vol. 12, No. 10, Mar. 1970, p. 1576, J. F. Ziegler.
*IBM TDB* "Epitaxial Garnet Films from Organo Metallic Sources", vol. 15, No. 2, Jul. 1972, V. Sadagopan et al.
*IBM TDB*, "FET Integrated Circuit having Two Polysilicon Layers", vol. 15, No. 10, Mar. 1973, pp. 3022-3023, S. A. Abbas.
"Thermal Oxidation of Phosphorus-Doped Polycrystalline Silicon in Wet Oxygen", H. Sunami, J. Electrochem. Soc: *Solid State Science and Technology*, Jun. 1978, vol. 125, No. 6, pp. 892-897.
"Grain Growth Mechanism of Heavily Phosphorus-Implanted Polycrystalline Silicon", Y. Wada et al., *J. Electrochem. Soc: Solid State Science and Technology*, Sep. 1978, vol. 125, No. 9, pp. 1499-1504.
*IBM TDB*, "Reduction of Leakage in $SiO_2$ Grown on Silicon Films", vol. 18, No. 5, Oct. 1975, p. 1615, A. B. Fowler.
*IBM TDB*, "Method to Avoid the Polysilicon Film Tearing Mechanism", vol. 20, No. 11B, Apr. 1978, p. 4961, E. A. Irene.
*IBM TDB*, "Double Polysilicon Dynamic Memory Cell with Polysilicon Bit Line", vol. 21, No. 9, Feb. 1979, pp. 3828-3831, V. L. Rideout.
Emmanuel et al., "Growth of Polycrystalline Silicon Films . . . ", *J. Electrochem. Soc.*, vol. 120, No. 11, Nov. 1973, pp. 1586-1591.
Jadus et al., "Simultaneous Polycrystalline . . . Growth", *I.B.M. Tech. Discl. Bull.*, vol. 14, No. 7, Dec. 1971, p. 2100.
Chaudhari et al., "Growing Crack-Free Single-Crystal Films", *I.B.M. Tech. Discl. Bull.*, vol. 15, No. 9, Feb. 1973, p. 2700.

*Primary Examiner*—L. Dewayne Rutledge
*Assistant Examiner*—W. G. Saba
*Attorney, Agent, or Firm*—Henry Powers

[57] ABSTRACT

Disclosed is a process for reducing microcracks and microvoids in the formation of polycrystalline (polysilicon) structures from initial layers of amorphous silicon by annealing. In annealing of amorphous silicon to the polycrystalline form, the crystal grains are thickness limited; and thus by maintaining the thickness below 1000 angstroms, the spacing between contrasting material forming the crystal grains can be minimized on anneal. The resultant equiaxial grains are used as seed crystals for epi-like growth of silicon from them into the required or desired layer thickness.

43 Claims, 13 Drawing Figures

EPITAXIALLY EXTENDED POLYCRYSTALLINE STRUCTURES UTILIZING A PREDEPOSIT OF AMORPHOUS SILICON WITH SUBSEQUENT ANNEALING

DESCRIPTION

TECHNICAL FIELD

This invention relates to the fabrication of semiconductor devices, and more particularly to the formation of polycrystalline silicon (polysilicon) films or layers in the fabrication of semiconductor devices such as integrated circuits.

One object of the present invention is to provide a novel process for fabricating integrated circuits of improved reliability.

Another object of the present invention is the formation of an improved layer of polysilicon on a supporting substrate.

Another object of this invention is the provision of a method for the formation of improved polysilicon layers in the fabrication of semiconductor devices.

Another object of this invention is a method of forming novel polysilicon layers of improved reliability in the fabrication of integrated circuits.

BACKGROUND ART

Polycrystalline silicon, or polysilicon as it is alternately referred to, is receiving much attention for many silicon devices. Typical applications of polysilicon can be found in the Anderson U.S. Pat. No. 3,370,980 issued Feb. 27, 1968; the Bean et al U.S. Pat. No. 3,519,901 issued July 7, 1970; the Smith U.S. Pat. No. 3,811,076 issued May 14, 1974; the Garnache U.S. Pat. No. 3,841,926 issued Oct. 15, 1974; the Lesk U.S. Pat. No. 3,900,345 issued Aug. 19, 1975; the Joshi et al U.S. Pat. No. 4,123,300 issued Oct. 31, 1978; the Wada et al article "Grain Growth Mechanism of Heavily Phosphorus-Implanted Polycrystalline Silicon", pp. 1499–1504, J. Electrochem. Soc.: Solid State Technology, Vol. 125, No. 9, September 1978; the Sunami article "Thermal Oxidation of Phosphorus-Doped Polycrystalline Silicon in Wet Oxygen", pp. 892–97, J. Electrochem. Soc.: Solid-State Science and Technology, Vol. 125, No. 6, June 1978; The Abbas article "FET Integrated Circuit Having Two Polysilicon Layers", pp. 3022–23, IBM-TDB, Vol. 15, No. 10, March 1973; the Fowler article "Reduction of Leakage in SiO$_2$ Grown on Silicon Films", p. 1615, IBM-TDB, Vol. 18, No. 5, October 1975; and the Irene article "Method to Avoid the Polysilicon Film Tearing Mechanism", p. 4961, IBM-TDB, Vol. 20, No. 11B, April 1978.

Polysilicon films have growing importance in the semiconductor fabrication art, particularly in the silicon gate technology which is employed in the fabrication of many MOS integrated circuits. In this technology, silicon dioxide films have been grown as intermediate insulators for double or higher level polysilicon devices for CCDs and random access memories. For another related application see the V. L. Rideout article "Double Polysilicon Dynamic Memory Cell With Polysilicon Bit Line", pp. 3828–31, IBM-TDB, Vol. 21, No. 9, February 1979. However, this technology has encountered inter-polysilicon layer shorts (in the double polysilicon process) which constitutes one of the major yield detractors in the resultant semiconductor devices. Until recently it has been believed that the quality of silicon oxides grown on the polysilicon gates governed the reliability of these devices.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings, and to the appended claims in which the various novel features of the invention are more particularly set forth.

Figure 1:
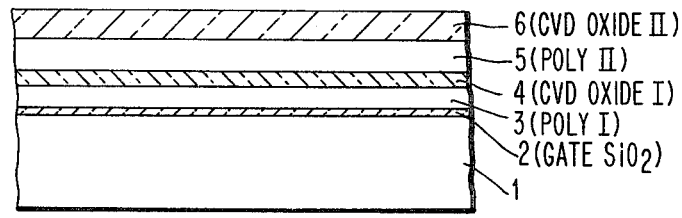
FIG. 1 is a schematic fragmentary sectional view illustrating a layered portion of a desired construction of a device fabricated by the double and/or higher level polysilicon technology.

FIG. 1 shows a desired construction of a portion of layered structure formed for the double and higher level polysilicon technology.

As shown the structure is comprised of a monocrystalline silicon substrate 1 which is normally oxidized to provide an overlying dielectric or insulating layer 2 represented as a gate SiO$_2$ in the figure. It is to be understood that although the silicon substrate is shown, for purposes of illustration of the invention, to be substantially undoped and without regions or pockets of different conductivity determining impurity types and concentration, that normally in the practice of the invention the substrate can be expected to have such regions conventional in integrated circuit devices which is inclusive of active and passive devices as well as means for isolating the devices from each other.

Figure 3A:
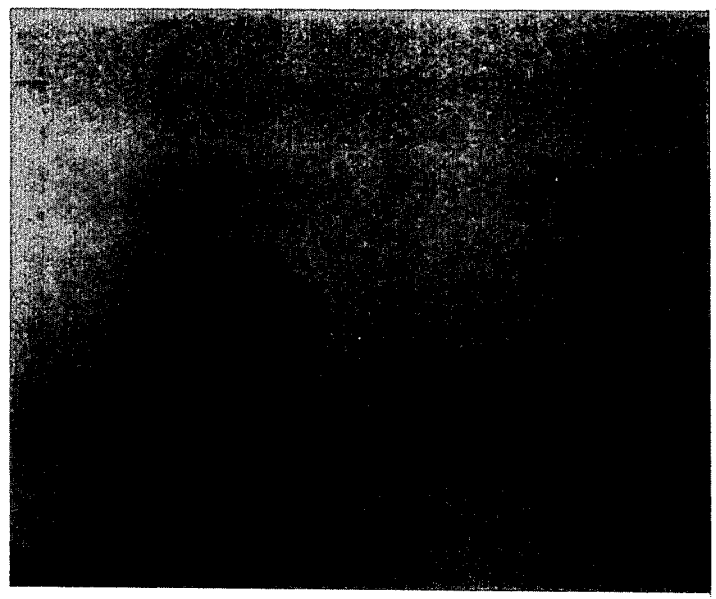
FIGS. 3A to 3F are Transmission Electron Micrographs (TEM) of non-monocrystalline silicon layers deposited at various temperatures.
Figure 3B:
Figure 3C:
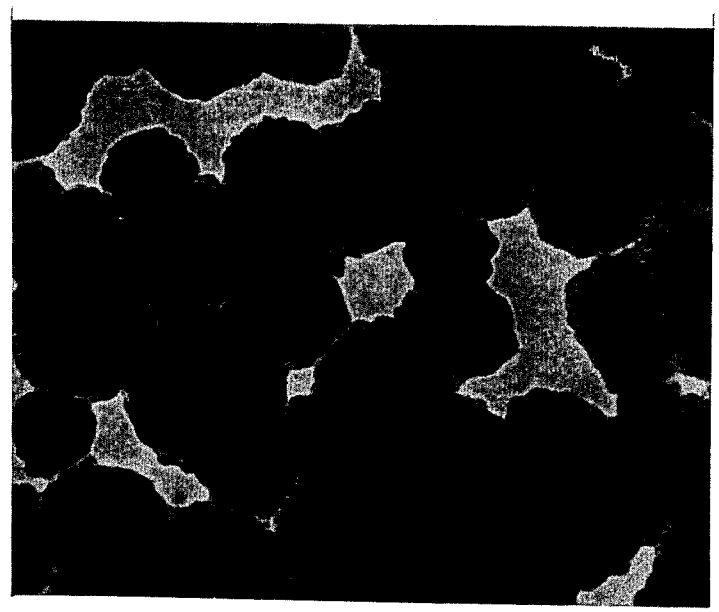
Figure 3D:
Figure 3F:
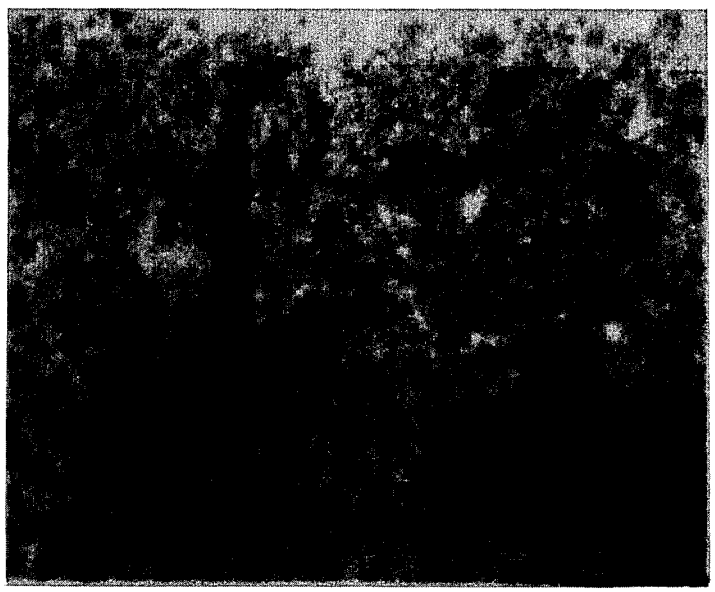
Figure 3E:

Deposited on the gate oxide 2, is a layer of polycrystalline silicon (indicated as a polysilicon field shield 3) which may optionally be doped or undoped, and designated in the drawing as Poly I. Heretofore, the conventional practice of depositing polysilicon layers was by decomposition of silane (with in-situ or post deposition doping to desired conductivities) to the required thickness (e.g. about 2000 to 6000 angstroms) at a temperature of 600° to 650° C., mostly at around 620° C. The silicon deposited on an oxide covered silicon substrate by decomposition of silane at temperatures of 580° C. to 650° C., which is commonly used in silicon gate and double polysilicon processes for LSI/VLSI, has a pseudocrystalline structure. The pseudocrystalline structure means that the silicon atoms do not have the periodicity of normal silicon crystal lattice. The silicon atoms are disordered and their interatomic distances are larger than the normal silicon crystal lattice parameter. The TEM pictures shown in FIGS. 3A and 3B represent the disordered structure of a ten second silicon deposit of 600° C. and 650° C. respectively. The silicon structure is featureless and essentially amorphous. Even the 700° C. and 800° C. ten second silicon deposits show little crystalline structure in FIGS. 3C and 3D respectively. FIG. 3E shows the TEM picture of a 900° C. ten second silicon deposit which is still only partially crystallized. The pseudocrystalline silicon has high internal stress. In subsequent hot processing such as diffusion, oxidation and/or annealing, the silicon atoms shift from their disordered positions into the ordered lattice sites around their respective nucleus. Since the interatomic distance of crystalline silicon is shorter than the pseudocrystalline silicon, the crystallization creates structural contraction. As a result, microcracks and microvoids can form in the silicon films. Shorts developed during subsequent processing (e.g. metallization) can be largely attributed to the presence of microcracks and microvoids.

An isolation layer 4 of $SiO_2$ is then deposited over the polysilicon field shield 3 by the thermal decomposition (CVD) of silane in an oxidizing atmosphere such as the presence of oxygen in an inert carrier gas. This CVD oxide is indicated as CVD Oxide I. The thickness of this CVD oxide layer 4 can vary in accordance with processing requirements which illustratively may be in the range of about 2000 to about 8000 angstroms. The foregoing is a typical processing sequence for formation of a single level polysilicon device.

In the fabrication of double and higher level polysilicon devices, a second layer 5 of polysilicon, illustratively of about 2000 to about 6000 angstroms, is deposited on the insulation oxide layer 4. This second polysilicon layer 5 is also indicated in the drawings as Poly II and will normally be doped, e.g. with phosphorous.

As shown in the drawings a third layer 6 of silicon dioxide is deposited over the second polysilicon layer 5, by the pyrolytic deposition techniques. This third oxide layer 6 is also indicated as CVD Oxide II, and illustratively may be in a thickness range of about 4000 to about 12000 angstroms.

Figure 2A:
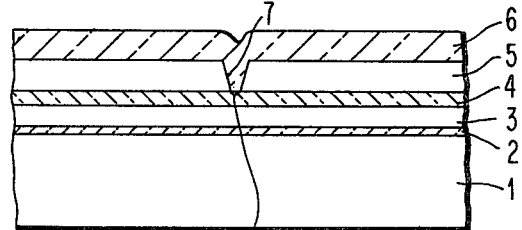
FIGS. 2A to 2C are schematic fragmentary sectional views illustrating the development of interpoly shorts resulting from microvoids ($\mu$voids) and/or microcracks ($\mu$cracks) defects in deposited polysilicon structures.
Figure 2B:
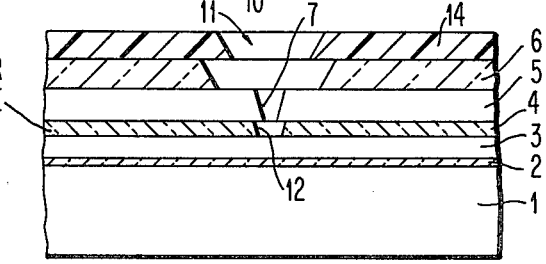
Figure 2C:
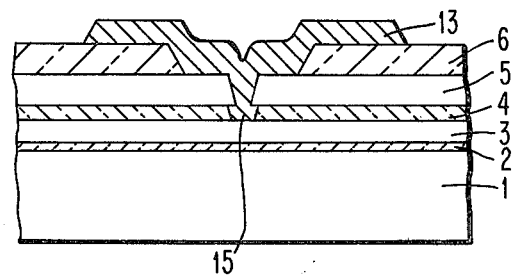

The presence of microcracks and microvoids in the polysilicon films or layer on developing interlayer shorts is illustrated in FIGS. 2A to 2C. These microcracks or voids may not necessarily generate shorts. However, the presence of the microcracks and/or voids exposes the insulator oxide layer 4 under the microcracks and/or microvoids 7. During the doping of the Polysilicon II layer 5 (e.g. diffusion with $POCl_3$), the exposed oxide 10, under the $\mu$cracks and/or voids, converts into a phospho-silicate glass (PSG). In subsequent etching (e.g. with buffered hydrofluoric acid, BHF), as for opening contact windows or vias 11, the PSG or oxide 10 under the $\mu$-crack/$\mu$-void 7 is also etched, and hence, extending the $\mu$-crack/$\mu$-void 7 into and through the insulator oxide layer 4 (CVD Oxide I) as a tunnel or gap 12. During metallization (e.g. for contact 13 utilizing conventional photolithographic techniques with resist 14), the extended micro cracks/$\mu$-voids 7/12 are filled with metal to form the short path extension 14 of the contact metallization 13.

In the manner indicated above, $\mu$-cracks/$\mu$-voids e.g. 7, in the polysilicon, e.g. layer 5 constitute a major factor in generating poly to poly shorts (e.g. from polysilicon layer 5 to polysilicon layer 3. In accordance with this invention it has been found that by proper control of the nucleation and growth of polysilicon films or layers, $\mu$-cracks/$\mu$-voids can be virtually eliminated. The process of this invention for growing $\mu$-crack/$\mu$-void free polysilicon films and layers comprises, in its broad context, the formation, under controlled conditions and, on a compatible supporting substrate, a discrete amorphous silicon layer or film which is annealed to convert the amorphous silicon layer to its polycrystalline form 21A, followed by epitaxially extending the crystal grains, of the polycrystalline layer 21A, to the desired thickness 22, to form the desired novel polysilicon layer 23.

BEST MODE FOR CARRYING OUT THE INVENTION

More specifically, the invention will be described with respect to the fabrication of CCD and random access memories, a fragmentary portion of which may be represented in FIGS. 2A to 2C taken in conjunction with FIG. 1 and FIGS. 4A to 4C for purposes of explanation. Also the invention will be described with reference to an intermediate structure fabricated up to the insulator oxide layer 4 with its sequential understructure of the field polysilicon layer 3, the thermally grown gate oxide 2 on a P-type silicon substrate 1. In this intermediate structure the gate oxide 2 may illustratively have a thickness of about 500 angstroms, with field polysilicon layer 3 having illustratively a thickness in the range of about 2500 to about 4000 angstroms.

In the continuing processing in accordance with this invention a thin continuous amorphous silicon film (see element 21, FIG. 4A) having a thickness less than about 1000 Å (angstrom), and preferably in the range of about 300 to about 500 Å and optionally 500 Å, is deposited by chemical vapor deposition on the insulator oxide layer 4, at a temperature of about 550° to about 600° C., and preferably from about 580° to about 600° C. The resultant initial amorphous silicon structure, deposited at 600° C. is shown in the Transmission Electron Micrograph (TEM) of FIG. 3A. For purposes of comparison, additional TEMs are shown for CVD deposited silicon (on $SiO_2$, insulator oxide layer 4) at 650° C. (FIGS. 3B and 3F), at 700° C. (FIG. 3C), at 800° C. (FIG. 3D) and at 900° C. (FIG. 3E), in illustration of the difference in the deposited films at the various temperatures.

Figure 4A:
FIGS. 4A to 4C are schematic fragmentary sectional views illustrating the development of the novel polycrystalline layers of this invention.
Figure 4B:
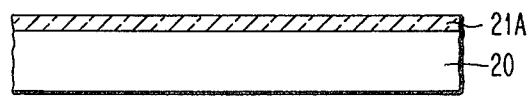
Figure 4C:
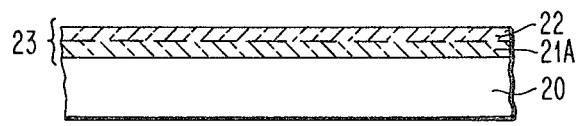

Next, the structure, e.g. in Poly II layer 5 of FIG. 1, is put through an anneal cycle (normally in-situ in the deposition chamber) at a temperature of about 780° C. to about 800° C., preferably at the upper 800° C. limit, to transform the amorphous silicon into a fine equiaxial crystalline silicon (e.g. element 21A, FIG. 4B). The crystallized silicon grains usually have grain sizes equivalent to the amorphous film-thicknesses, i.e. about 500 Å grain size for 500 Å thick films and 300 Å grain size for 300 Å thick films. The heating time required for crystallization is about 20 to about 40 minutes. The equiaxial grain structure means that the grains are in their stable state, wherein further heating will cause little change in grain structure. The crystallized silicon layer will serve as a seed layer in subsequent deposition.

It may be noted that during crystallization of the initial amorphous silicon film, microcracks/microvoids may form due to the fact that the interatomic distance of the crystal silicon is usually smaller than that of the amorphous silicon. However, these microcracks/voids will be filled during subsequent film growth.

In the next operation, the temperature is reduced to about 680° to about 700° C., preferably 700° C., and the CVD deposition of silicon is resumed onto the fine grained polycrystalline seed layer 21A (FIG. 4B) to build up the film thickness 22 (FIG. 4C), e.g. illustratively about 3000 to about 6000 Å, to form the novel polysilicon layer 23 (FIG. 4C) as required or desired for integrated circuit applications, e.g. the Poly II layer 5 of FIG. 1 and FIGS. 2A to 2C.

The deposition temperature must be sufficiently high to continue the substrate crystalline structure 21A, FIG. 4B, in an epi-like extension in the vertical direction but not enough to have lateral grain growth.

As indicated, the grain growth in the vertical direction is an epitaxial-like extension of the polycrystalline silicon seed layer grain structure, while in the lateral direction, it must interfere with the neighboring grain growth, thus requiring more energy.

The novel/modified polycrystalline films 23 (21A/22) grown in accordance with this invention as described above, will have fine grains and will be virtually free of $\mu$-cracks/$\mu$-voids. This fine grain structure is also desirable because the film asperity is small which results in reduced poly/poly breakdown voltage degradation, e.g. between the Poly I layer 3 and the Poly II layer 5. The films are free of $\mu$-cracks/$\mu$-voids because the asgrown, films have stable equiaxial grain structure which will resist structural changes even if the films are heated to 1000° C. It may be noted that the crystallization temperature of 800° C. (for the amorphous silicon film 21, FIG. 4A) is much higher than the required minimum crystallization (anneal) temperature of about 650° C. The purpose here is to develop the film structure into stable equi-axial grains, where the crystallized grains are to later act as seed during subsequent silicon deposition.

It is further noted that the second or final CVD silicon deposition (e.g. for the epi-like extension 22, FIG. 4B), the temperature is lowered to 680°-700° C., which is again higher than the minimum polysilicon deposition temperature. Deposition at 680°-700° C. assures that the internal stress of the grown grains will be sufficiently low so that, in subsequent heatings, little grain growth will occur. On the other hand, this deposition temperature is sufficiently low so that the deposition will extend the seed structure in the vertical direction only with relatively little in the lateral direction, thus to limit the lateral grain growth during the deposition.

While the invention has been illustrated and described with respect to preferred embodiments of the invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A method of forming a polycrystalline layer on an insulator coating of a silicon integrated circuit
   depositing from a silicon forming gaseous phase a discrete amorphous silicon layer in a thickness not exceeding 1000 angstroms on said insulator coating at a temperature in the range of about 550° to 600° C.;
   heating the resultant structure at a temperature of about 800° C. to convert said amorphous silicon layer to an equiaxial polycrystalline seed layer, and
   epitaxially extending the crystal grains of said polycrystalline seed layer by heating thereof in a silicon forming ambient at a temperature in the range of about 650° to about 700° C. for a time sufficient to grow the thickness desired.

2. The method of claim 1 wherein said insulating layer is thermally grown silicon dioxide.

3. The method of claim 1 wherein said insulating layer is a chemically vapor deposited silicon dioxide.

4. The method of claim 1 wherein said extended polycrystalline layer is doped with a conductivity type determining impurity.

5. A method for forming polycrystalline layers on an insulator coating of an integrated circuit device, comprising:
   forming a first polycrystalline silicon layer on said insulator coating,
   forming a second insulator coating on said polycrystalline silicon layer,
   depositing from a silicon forming gaseous phase a discrete amorphous silicon layer in a thickness not exceeding 1000 angstroms on said second insulator coating at a temperature in the range of about 550° C. to about 600° C.,
   heating the resultant structure at a temperature of about 800° C. to convert said amorphous layer to a second polycrystalline layer having equiaxial grains, and
   epitaxially extending the crystal grains of said second polycrystalline layer, by heating thereof in a silicon forming ambient at a temperature in the range of about 650° C. to about 700° C. for a time sufficient to grow the thickness desired.

6. The method of claim 5 wherein said extended polycrystalline layer is doped with a conductivity type determining impurity.

7. The method of claim 5 wherein said second polycrystalline layer is doped.

8. The method of claim 5 including forming a third insulating coating on said second polycrystalline layer,
   forming a via hole through said third insulating coating, to the second said polycrystalline layer, and
   forming a conductive metal contact in said via opening.

9. The method of claim 8 wherein said second polycrystalline layer is doped.

10. The method of claim 5 wherein the first said insulating coating is a thermally grown silicon dioxide.

11. The method of claim 10 wherein said second polycrystalline layer is doped.

12. The method of claim 10 wherein at least one of said second and third insulating coatings comprises a chemically vapor deposited silicon dioxide.

13. The method of claim 12 wherein said second polycrystalline layer is doped.

14. The method of claim 5 wherein the first polycrystalline layer is formed by depositing a discrete amorphous silicon layer in a thickness not exceeding about 1000 angstroms on the first said insulating coating at a temperature in the range of about 550 to about 600° C., heating this said amorphous silicon layer at a temperature of about 800° C. to convert it to a polycrystalline seed layer, and epitaxially extending the crystal grains of said polycrystalline layer in a silicon forming ambient at a temperature in the range of about 650° C. to about 700° C. for a time sufficient to grow the desired thickness of the said first polycrystalline layer.

15. The method of claim 14 wherein said extended polycrystalline layer is doped with a conductivity type determining impurity.

16. The method of claim 14 including forming a third insulating coating on said second polycrystalline layer,
   forming a via hole through said third insulating coating, to the second said polycrystalline layer, and
   forming a conductive metal contact in said via opening.

17. The method of claim 14 wherein said second polycrystalline layer is doped.

18. The method of claim 14 wherein the first said insulating coating is a thermally grown silicon dioxide.

19. The method of claim 18 wherein at least one of said second and third insulating coatings comprises a chemically vapor deposited silicon dioxide.

20. The method of claim 19 wherein said second polycrystalline layer is doped.

21. The method of claim 18 wherein said second polycrystalline layer is doped.

22. The method of claim 1 wherein said polycrystalline seed layer has grain sizes corresponding to the thickness of said layer.

23. The method of claim 22 wherein said insulating layer is thermally grown silicon dioxide.

24. The method of claim 22 wherein said insulating layer is a chemically vapor deposited silicon dioxide.

25. The method of claim 22 wherein said extended polycrystalline layer is doped with a conductivity type determining impurity.

26. The method of claim 5 wherein said grains of said sizes corresponding to the thickness of said second layer.

27. The method of claim 26 wherein said extended second polycrystalline layer is doped with a conductivity type determining impurity.

28. The method of claim 26 wherein said second polycrystalline layer is doped.

29. The method of claim 26 including forming a third insulating coating on said second polycrystalline layer,
forming a via hole through said third insulating coating, to the second said polycrystalline layer, and
forming a conductive metal contact in said via opening.

30. The method of claim 27 wherein said second polycrystalline layer is doped.

31. The method of claim 26 wherein the first said insulating coating is a thermally grown silicon dioxide.

32. The method of claim 31 wherein said second polycrystalline layer is doped.

33. The method of claim 31 wherein at least one of said second and third insulating coatings comprises a chemically vapor deposited silicon dioxide.

34. The method of claim 33 wherein said second polycrystalline layer is doped.

35. The method of claim 26 wherein the first polycrystalline layer is formed by depositing from a silicon forming gaseous phase a discrete amorphous silicon layer in a thickness not exceeding about 1000 angstroms on the first said insulating coating at a temperature in the range of about 550 to about 600° C.,
heating this said amorphous silicon layer at a temperature of about 750° C. to about 800° C. to convert it to an equiaxial polycrystalline seed layer, and
epitaxially extending the crystal grains of said polycrystalline layer in a silicon forming ambient at a temperature in the range of about 650° C. to about 700° C. for a time sufficient to grow the desired thickness of the said first polycrystalline layer.

36. The method of claim 35 wherein said extended first polycrystalline layer is doped with a conductivity type determining impurity.

37. The method of claim 35 including forming a third insulating coating on said second polycrystalline layer,
forming a via hole through said third insulating coating, to the second said polycrystalline layer, and
forming a conductive metal contact in said via opening.

38. The method of claim 35 wherein said second polycrystalline layer is doped.

39. The method of claim 35 wherein the first said insulating coating is a thermally grown silicon dioxide.

40. The method of claim 39 wherein at least one of said second and third insulating coatings comprises a chemically vapor deposited silicon dioxide.

41. The method of claim 40 wherein said second polycrystalline layer is doped.

42. The method of claim 39 wherein said second polycrystalline layer is doped.

43. The method of claim 35 wherein the said first layer grains have a size corresponding to the thickness of said first layer.

* * * * *

UNITED STATES PATENT AND TRADEMARK OFFICE
CERTIFICATE OF CORRECTION

PATENT NO. : 4,358,326

DATED : November 9, 1982

INVENTOR(S) : V. Y. Doo

It is certified that error appears in the above—identified patent and that said Letters Patent is hereby corrected as shown below:

Column 5, line 51  after "circuit" insert --device comprising--

Column 7, line 38  change "27" to --29--

Signed and Sealed this

Thirty-first Day of May 1983

[SEAL]

Attest:

DONALD J. QUIGG

Attesting Officer  Acting Commissioner of Patents and Trademarks